United States Patent
Kawashima

(10) Patent No.: US 8,310,032 B2
(45) Date of Patent: Nov. 13, 2012

(54) WAFER AND METHOD OF MANUFACTURING SEMICONDUCTOR DEVICE

(75) Inventor: Yoshitsugu Kawashima, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/901,187

(22) Filed: Oct. 8, 2010

(65) Prior Publication Data

US 2011/0084364 A1    Apr. 14, 2011

(30) Foreign Application Priority Data

Oct. 9, 2009 (JP) ................................. 2009-235173

(51) Int. Cl.
*H01L 23/544* (2006.01)
(52) U.S. Cl. ........ 257/620; 257/618; 257/619; 257/623; 257/E23.179; 438/460; 438/462; 438/465
(58) Field of Classification Search .................. 257/618, 257/619, 620, 623, E23.179; 438/460, 462, 438/465
See application file for complete search history.

(56) References Cited

U.S. PATENT DOCUMENTS

| | | | | |
|---|---|---|---|---|
| 2003/0160303 A1* | 8/2003 | Hirokawa et al. | ............. | 257/620 |
| 2004/0212047 A1* | 10/2004 | Joshi et al. | .................... | 257/620 |
| 2005/0140006 A1* | 6/2005 | Takahashi | ..................... | 257/738 |
| 2007/0057349 A1* | 3/2007 | Yang | ............................. | 257/620 |
| 2008/0023802 A1 | 1/2008 | Suzuki | | |

FOREIGN PATENT DOCUMENTS

| | | |
|---|---|---|
| JP | 2003-203882 | 7/2003 |
| JP | 2008-028243 | 2/2008 |

* cited by examiner

*Primary Examiner* — Peniel M Gumedzoe
(74) *Attorney, Agent, or Firm* — Young & Thompson

(57) ABSTRACT

In a wafer, a first chip region and a second chip region are separated from each other by a dicing region. The dicing region includes: a first center region; a first intermediate region located on the first chip region's side of the first center region; a second intermediate region located on the second chip region's side of the first center region; a first outer region located on the first chip region's side of the first intermediate region; and a second outer region located on the second chip region's side of the second intermediate region. Surfaces of the first and second intermediate regions are respectively covered by bank-shaped resin films extending in a longitudinal direction of the dicing region. Respective surfaces of the first center region, the first outer region and the second outer region are not covered by resin films.

4 Claims, 8 Drawing Sheets

WAFER AND METHOD OF MANUFACTURING SEMICONDUCTOR DEVICE

INCORPORATION BY REFERENCE

This application is based upon and claims the benefit of priority from Japanese patent application No. 2009-235173, filed on Oct. 9, 2009, the disclosure of which is incorporated herein in its entirety by reference.

BACKGROUND

1. Field of the Invention

The present invention relates to a wafer and a method of manufacturing a semiconductor device. In particular, the present invention relates to a wafer to be diced into a plurality of chips and a method of manufacturing a semiconductor device including a process of dicing a wafer into a plurality of chips.

2. Description of Related Art

Typically, a plurality of chip regions are formed on a semiconductor wafer. The respective chip regions are separated from each other by dicing streets. The dicing is carried out by cutting the semiconductor wafer along the dicing streets by using a dicing blade. It is known that in the dicing process, chipping of the semiconductor wafer may be caused on the cut surface, because the semiconductor wafer is physically cut by the blade.

Meanwhile, in the dicing process, a surface of the semiconductor wafer is typically covered by polyimide resin and the like for protecting the surface. A method for suppressing the occurrence of the chipping by using the polyimide resin is disclosed, for example, in Patent Document 1 (Japanese Patent Publication JP-2003-203882). According to the method, the chipping is suppressed by covering a surface of a region of the semiconductor wafer to be cut by the blade with the polyimide resin, FIG. 1 is a cross-sectional view of a compound semiconductor substrate 111 used in the above-described manufacturing method. A plurality of semiconductor device formation regions 112 are provided on a top surface of the compound semiconductor substrate 111, and a dicing region 114 is provided between the plurality of semiconductor device formation regions 112. Polyimide films 116 as protection films are formed on respective surfaces of the semiconductor device formation region 112 and the dicing region 114. A space is provided between the polyimide film 116 of the dicing region 114 and the polyimide film 116 of the semiconductor device formation region 112. As shown in FIG. 2, the compound semiconductor substrate 111 is cut along the dicing region 114. Film stress is generated at stress change points 119 corresponding to side edges t of the polyimide films 116, and stress in the compound semiconductor substrate 111 is changed due to the film stress of the polyimide film 116. As a result, crack generated at the cut point of the compound semiconductor substrate 111 due to the dicing stops at the stress change point 119 and does not intrude into the semiconductor device formation region 112. It is thus possible to suppress the occurrence of the chipping on the diced chip. It should be noted that Patent Document 2 (Japanese Patent Publication JP-2008-28243) discloses a technique of forming an anti-chipping wall by using a metal interconnection for preventing the chipping.

The inventor of the present application has recognized the following points. According to the technique described in FIGS. 1 and 2, the polyimide resin as well as the semiconductor wafer is cut by the blade and thus the polyimide resin in filaments is attached as shaving to the cut surface of the semiconductor wafer.

SUMMARY

In an aspect of the present invention, a wafer is provided. The wafer has: a first chip region in which a semiconductor device is formed; a second chip region in which a semiconductor device is formed; and a first dicing region. The first chip region and the second chip region are separated from each other by the first dicing region. A part of the first dicing region sandwiched by the first chip region and the second chip region has: a first center region extending in a first longitudinal direction of the first dicing region; a first intermediate region located on the first chip region's side of the first center region and extending in the first longitudinal direction; a second intermediate region located on the second chip region's side of the first center region and extending in the first longitudinal direction; a first outer region located on the first chip region's side of the first intermediate region and extending in the first longitudinal direction; and a second outer region located on the second chip region's side of the second intermediate region and extending in the first longitudinal direction. A surface of the first intermediate region is covered by a bank-shaped first resin film extending in the first longitudinal direction. A surface of the second intermediate region is covered by a bank-shaped second resin film extending in the first longitudinal direction. Respective surfaces of the first center region, the first outer region and the second outer region are not covered by resin films.

In another aspect of the present invention, a method of manufacturing a semiconductor device is provided. The method includes: dicing a wafer into a plurality of chips. The wafer has: a first chip region in which a semiconductor device is formed; a second chip region in which a semiconductor device is formed; and a first dicing region. The first chip region and the second chip region are separated from each other by the first dicing region. A part of the first dicing region sandwiched by the first chip region and the second chip region has: a first center region extending in a first longitudinal direction of the first dicing region; a first intermediate region located on the first chip region's side of the first center region and extending in the first longitudinal direction; a second intermediate region located on the second chip region's side of the first center region and extending in the first longitudinal direction; a first outer region located on the first chip region's side of the first intermediate region and extending in the first longitudinal direction; and a second outer region located on the second chip region's side of the second intermediate region and extending in the first longitudinal direction. A surface of the first intermediate region is covered by a bank-shaped first resin film extending in the first longitudinal direction. A surface of the second intermediate region is covered by a bank-shaped second resin film extending in the first longitudinal direction. Respective surfaces of the first center region, the first outer region and the second outer region are not covered by resin films. The dicing the wafer into the plurality of chips includes: cutting the first center region along the first longitudinal direction.

According to the present invention, the wafer and the method of manufacturing the semiconductor device are provided, in which the crack caused at the time of the dicing can be prevented from reaching the chip region and furthermore the attachment of the shaving such as polyimide resin can be prevented.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
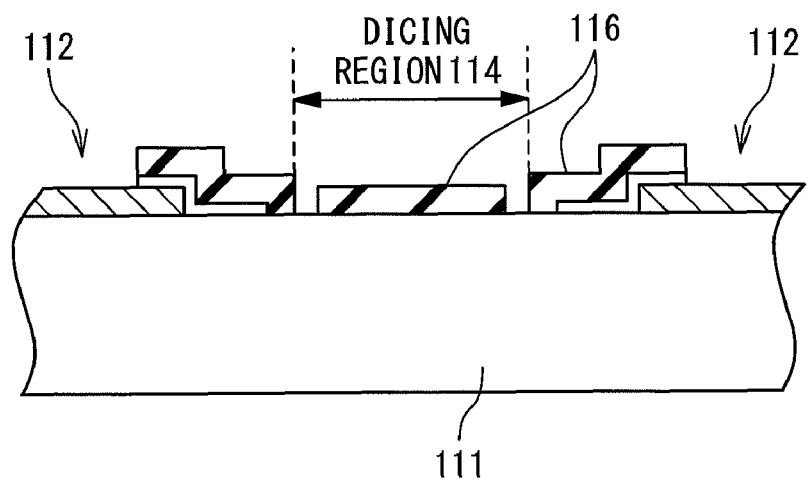
FIG. 1 is a cross-sectional view of a typical semiconductor substrate.
Figure 2:
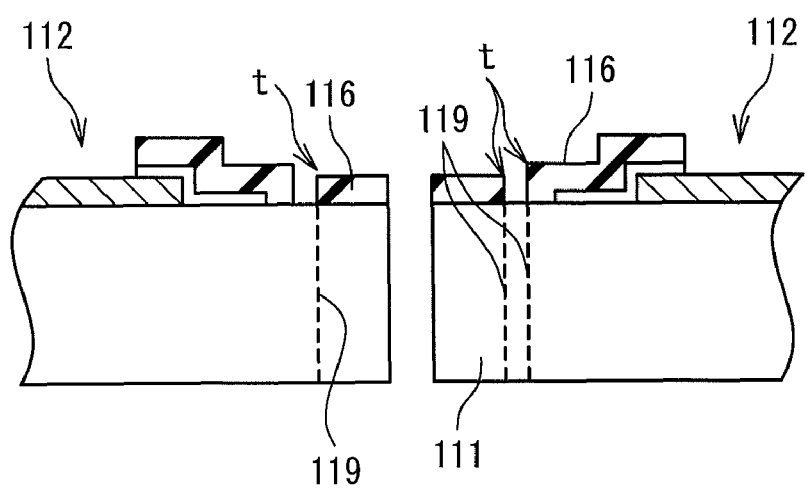
FIG. 2 shows a state where the typical semiconductor substrate is cut along a dicing region.
Figure 3:
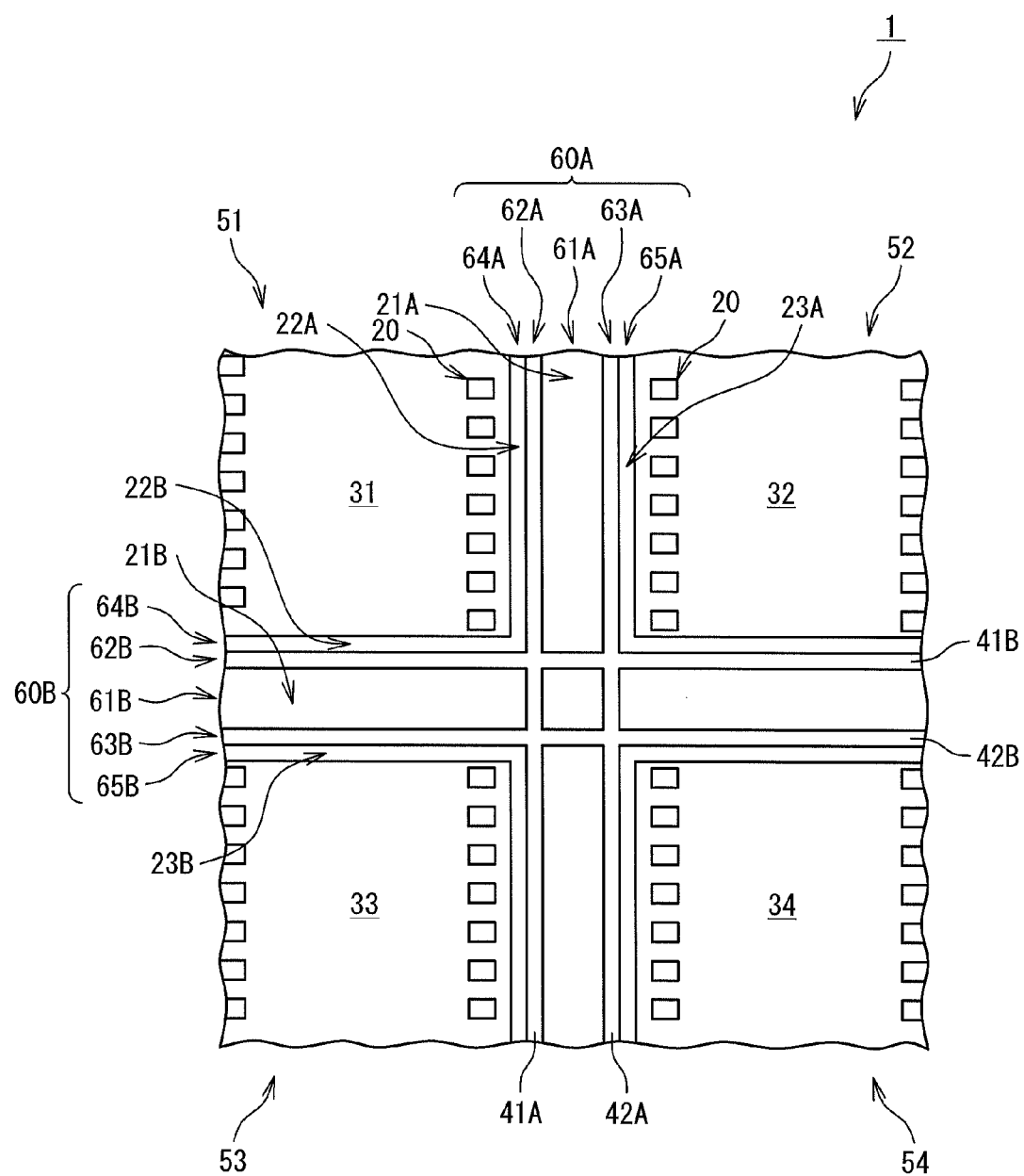
FIG. 3 is a top view of a wafer according to a first embodiment of the present invention.

FIG. 3 is a top view of a wafer 1 according to a first embodiment of the present invention. The wafer 1 has chip regions 51 to 54 and dicing regions 60A and 60B. A semiconductor device is formed in each of the chip regions 51 to 54. The dicing regions 60A and 60B are orthogonal to each other. The chip regions 51 and 52 are separated from each other by the dicing region 60A. The chip regions 53 and 54 are separated from each other by the dicing region 60A. The chip regions 51 and 53 are separated from each other by the dicing region 60B. The chip regions 52 and 54 are separated from each other by the dicing region 60B. The dicing region 60A is sandwiched by the chip region 51 and the chip region 52 and is sandwiched by the chip region 53 and the chip region 54. The dicing region 60B is sandwiched by the chip region 51 and the chip region 53 and is sandwiched by the chip region 52 and the chip region 54.

Respective surfaces of the chip regions 51 to 54 are covered by chip region protection films 31 to 34. Opening sections 20 are respectively formed on the chip region protection films 31 to 34. The chip region protection films 31 to 34 are formed of resin such as polyimide resin.

A part of the dicing region 60A sandwiched by the chip regions 51 and 52 includes: a center region 61A; an intermediate region 62A located on the chip region 51's side of the center region 61A; an intermediate region 63A located on the chip region 52's side of the center region 61A; an outer region 64A located on the chip region 51's side of the intermediate region 62A; and an outer region 65A located on the chip region 52's side of the intermediate region 63A. Each of the center region 61A, the intermediate region 62A, the intermediate region 63A, the outer region 64A and the outer region 65A extends in a longitudinal direction of the dicing region 60A. A surface of the intermediate region 62A and a surface of the intermediate region 63A are respectively covered by anti-chipping walls 41A and 42A as bank-shaped protection resin films. The anti-chipping walls 41A and 42A are formed of the same material as that of the chip region protection films 31 to 34 and extend in the longitudinal direction of the dicing region 60A. Respective surfaces of the center region 61A, the outer region 64A and the outer region 65A are not covered by protection resin films.

A part of the dicing region 60B sandwiched by the chip regions 51 and 53 includes: a center region 61B; an intermediate region 62B located on the chip region 51's side of the center region 61B; an intermediate region 63B located on the chip region 52's side of the center region 61B; an outer region 64B located on the chip region 51's side of the intermediate region 62B; and an outer region 65B located on the chip region 53's side of the intermediate region 63B. Each of the center region 61B, the intermediate region 62B, the intermediate region 63B, the outer region 64B and the outer region 65B extends in a longitudinal direction of the dicing region 60B. A surface of the intermediate region 62B and a surface of the intermediate region 63B are respectively covered by anti-chipping walls 41B and 42B as bank-shaped protection resin films. The anti-chipping walls 41B and 42B are formed of the same material as that of the chip region protection films 31 to 34 and extend in the longitudinal direction of the dicing region 60B. Respective surfaces of the center region 61B, the outer region 64B and the outer region 65B are not covered by protection resin films.

The anti-chipping walls 41A and 42A extend in the longitudinal direction of the dicing region 60A so as to cross the dicing region 60B. The anti-chipping walls 41B and 42B extend in the longitudinal direction of the dicing region 60B so as to cross the dicing region 60A. The anti-chipping wall 41A intersects with the anti-chipping walls 41B and 42B. The anti-chipping wall 42A intersects with the anti-chipping walls 41B and 42B.

The anti-chipping wall 41A is separated from the chip region protection films 31 and 33. The anti-chipping wall 42A is separated from the chip region protection films 32 and 34. The anti-chipping wall 41B is separated from the chip region protection films 31 and 32. The anti-chipping wall 42B is separated from the chip region protection films 33 and 34.

Figure 4:
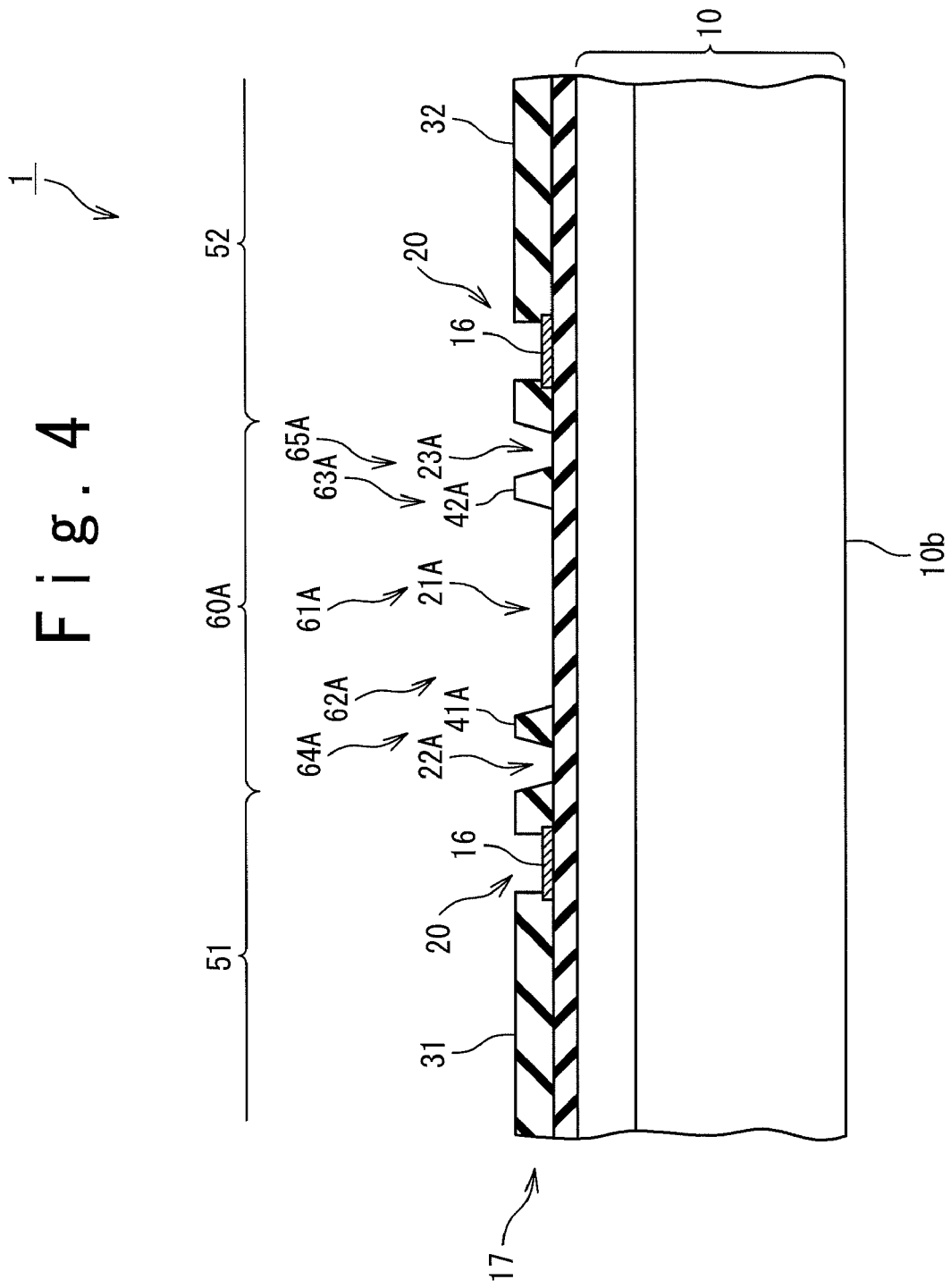
FIG. 4 is a cross-sectional view of the wafer according to the first embodiment.

FIG. 4 is a cross-sectional view of the wafer 1. A bonding pad 16 is exposed at the each opening section 20.

Figure 5:
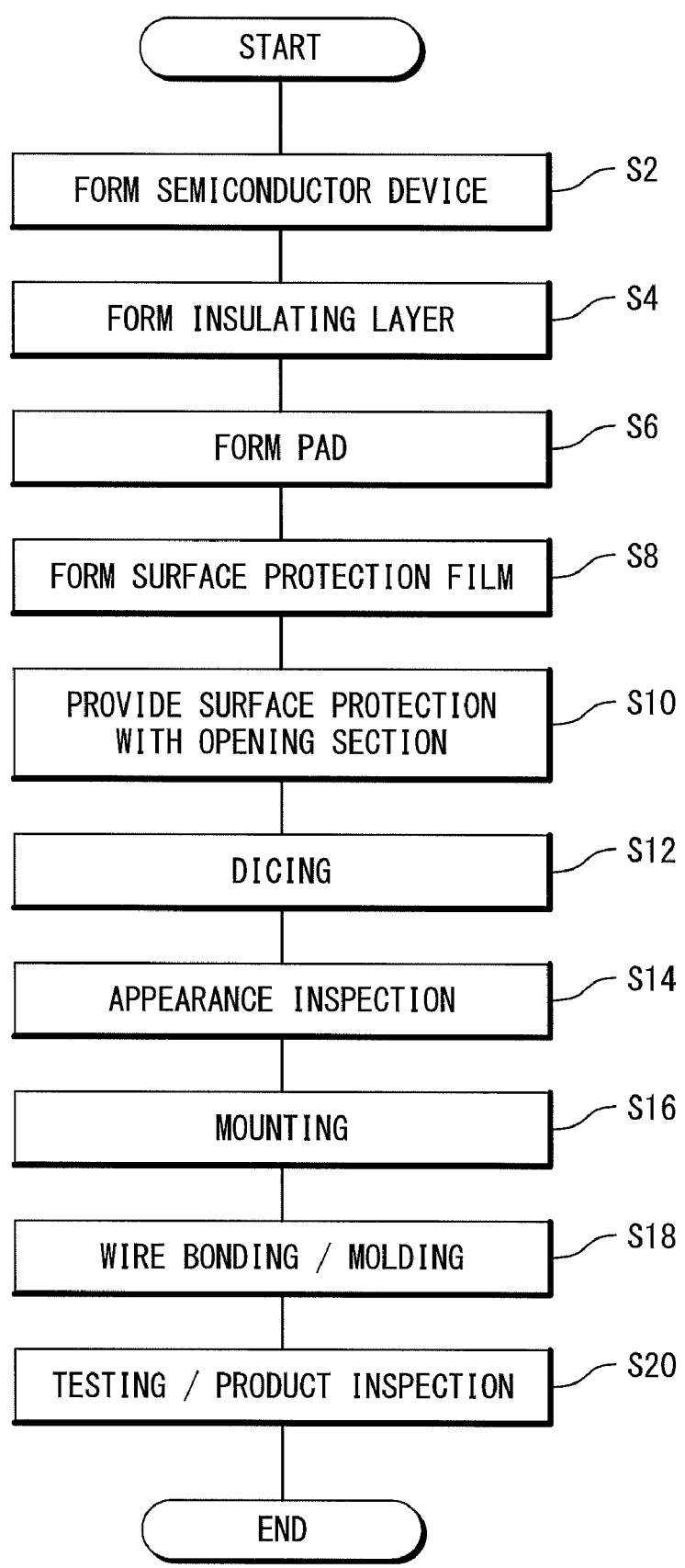
FIG. 5 is a flowchart showing a method of manufacturing a semiconductor device according to the first embodiment.

FIG. 5 is a flowchart showing a method of manufacturing a semiconductor device according to the first embodiment of the present invention. The wafer 1 is manufactured as an interim product in the method of manufacturing the semiconductor device according to the present embodiment. The method of manufacturing the semiconductor device according to the present embodiment includes a semiconductor device formation step S2, an insulating layer formation step S4, a pad formation step S6, a surface protection film formation step S8, an opening section formation step S10, a dicing step S12, an appearance inspection step S14, a mounting step S16, a wire bonding/molding step S18 and a testing/product inspection step S20.

Figure 6:
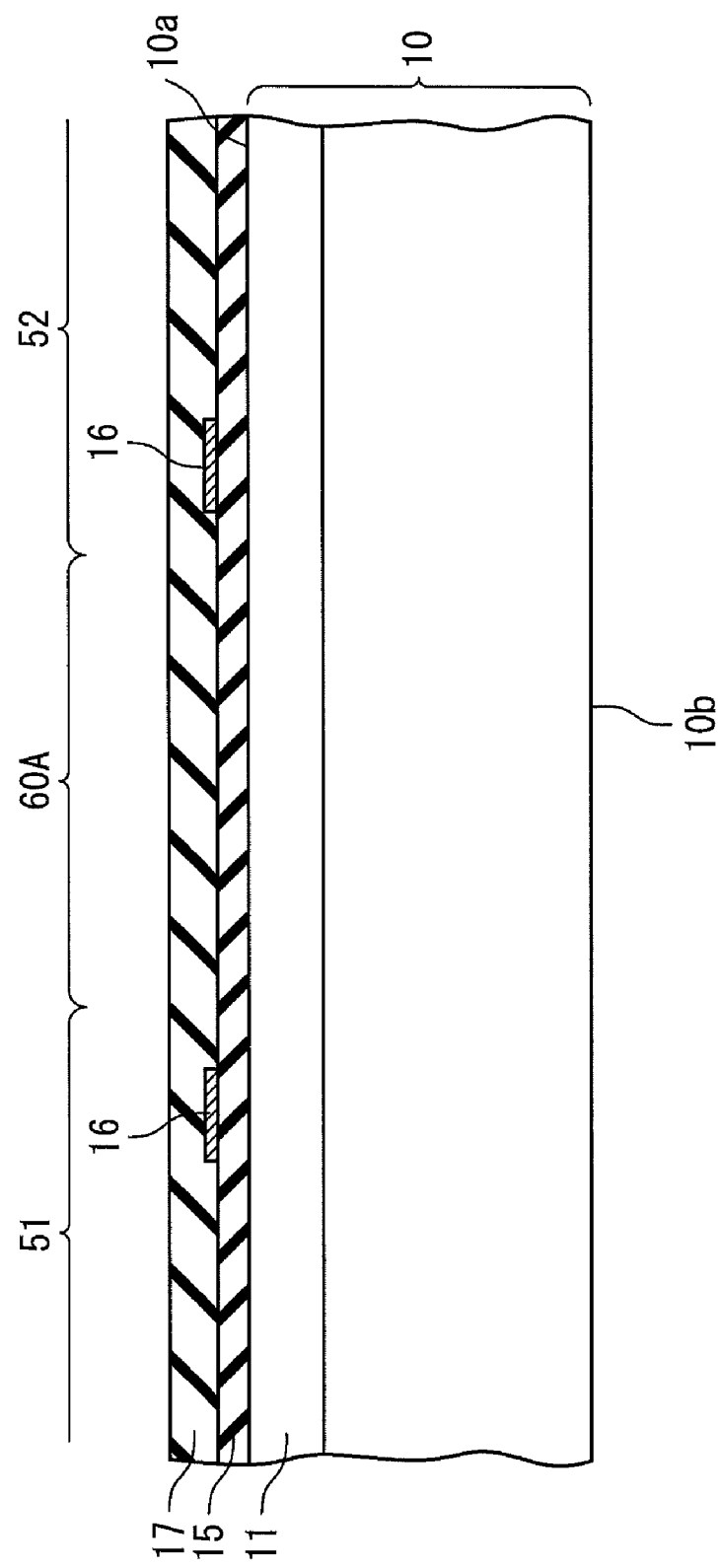
FIG. 6 is a cross-sectional view of the wafer for explaining a manufacturing process of the wafer according to the first embodiment.

Let us explain the semiconductor device formation step S2, the insulating layer formation step S4, the pad formation step S6 and the surface protection film formation step S8 with reference to FIG. 6.

In the semiconductor device formation step S2, semiconductor devices (not shown) are formed on a substrate 10 of the wafer 1. The substrate 10 is, for example, a semiconductor substrate such as a silicon substrate. The substrate 10 has a surface 10a and a back surface 10b. In the Step S2, impurities are injected into the surface 10a side of the substrate 10 to form a diffusion layer 11 and semiconductor devices (not shown) are formed in the respective chip regions 51 and 54.

In the insulating layer formation step S4, an insulating layer 15 is formed on the diffusion layer 11. Interconnections (not shown) are formed in the insulating layer 15. Some of the interconnections are connected to the semiconductor devices formed in the Step S2.

In the pad formation step S6, the bonding pad 16 is formed on the insulating layer 15 in each of the chip regions 51 to 54. The bonding pad 16 is connected to the interconnection formed in the insulating layer 15.

In the surface protection film formation step S8, a surface protection film 17 is so formed as to cover the entire surface of the wafer 1. The surface protection film 17 is formed of resin such as polyimide resin.

The opening section formation step S10 will be described with reference to FIG. 4. In the opening section formation step S10, an opening section 20 for exposing the bonding pad 16 is formed at a part of the surface protection film 17 covering a surface of the chip region 51, an opening section 20 for exposing the bonding pad 16 is formed at a part of the surface protection film 17 covering a surface of the chip region 52, an opening section 21A is formed at a part of the surface protection film 17 covering a surface of the center region 61A, an opening section 22A is formed at a part of the surface protection film 17 covering a surface of the outer region 64A, and an opening section 23A is formed at a part of the surface protection film 17 covering a surface of the outer region 65A.

The opening section formation step S10 will be further described with reference to FIG. 3. In the opening section formation step S10, an opening section 20 for exposing the bonding pad 16 is formed at a part of the surface protection film 17 covering a surface of the chip region 53, an opening section 20 for exposing the bonding pad 16 is formed at a part of the surface protection film 17 covering a surface of the chip region 54, an opening section 21B is formed at a part of the surface protection film 17 covering a surface of the center region 61B, an opening section 22B is formed at a part of the surface protection film 17 covering a surface of the outer region 64B, an opening section 23B is formed at a part of the surface protection film 17 covering a surface of the outer region 65B, and an opening section 24 is formed at a part of the surface protection film 17 covering a surface of a center part of the intersection region of the dicing regions 60A and 60B.

Consequently, the chip region protection films 31, 32, 33 and 34 and the anti-chipping walls 41A, 42A, 41B and 42B are formed from the surface protection film 17. Moreover, the center regions 61A and 61B and the outer regions 64A, 64B, 65A and 65B are not covered by the surface protection film 17.

According to the present embodiment, it is possible to form the anti-chipping walls 41A, 42A, 41B and 42B only by modifying a reticle used for forming the opening sections 20. Thus, there is no need to add any new process.

The surface protection film 17 may be formed of nonphotosensitive polyimide resin or may be formed of photosensitive polyimide resin. In the case where the surface protection film 17 is formed of nonphotosensitive polyimide resin, a photoresist film is formed on the surface protection film 17 and then a pattern of the reticle for forming the opening sections 20 is transcribed into the photoresist film. In the case where the surface protection film 17 is formed of photosensitive polyimide resin, a pattern of the reticle for forming the opening sections 20 is transcribed into the surface protection film 17.

Figure 7:
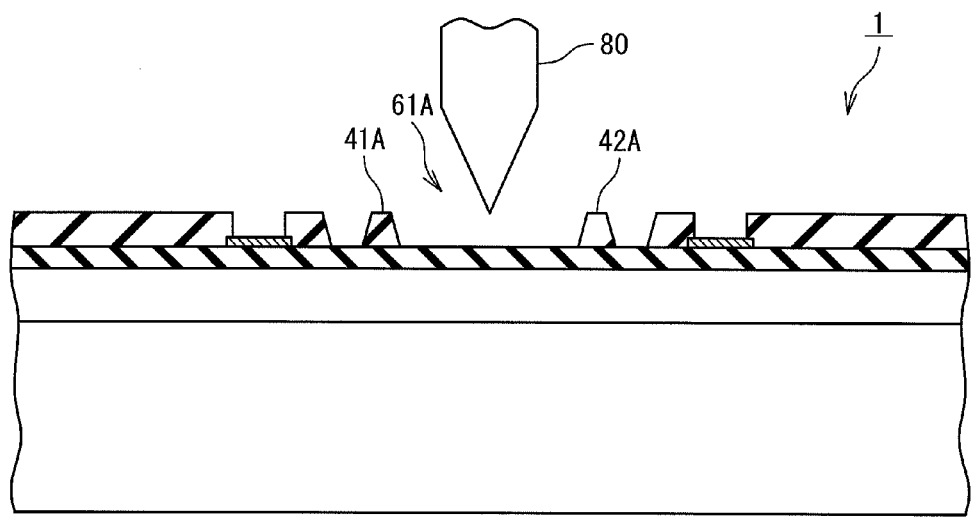
FIG. 7 is a cross-sectional view of the wafer during a dicing process according to the first embodiment.

The dicing step S12 will be described with reference to FIG. 7. In the dicing step S12, a dicing blade 80 is used to cut the wafer 1 along a center line of the dicing region 60A and to cut the wafer 1 along a center line of the dicing region 60B. At this time, the center region 61A is cut along the longitudinal direction of the dicing region 60A, and the center region 61B is cut along the longitudinal direction of the dicing region 60B. When the center region 61A is cut along the longitudinal direction of the dicing region 60A, the anti-chipping walls 41A and 42A are not cut. When the center region 61B is cut along the longitudinal direction of the dicing region 60B, the anti-chipping walls 41B and 42B are not cut. In the dicing step S12, the wafer 1 is diced into a plurality of chips. The plurality of chips include a chip 71 including the chip region 51, a chip 72 including the chip region 52, a chip including the chip region 53 and a chip including the chip region 54.

Figure 8:
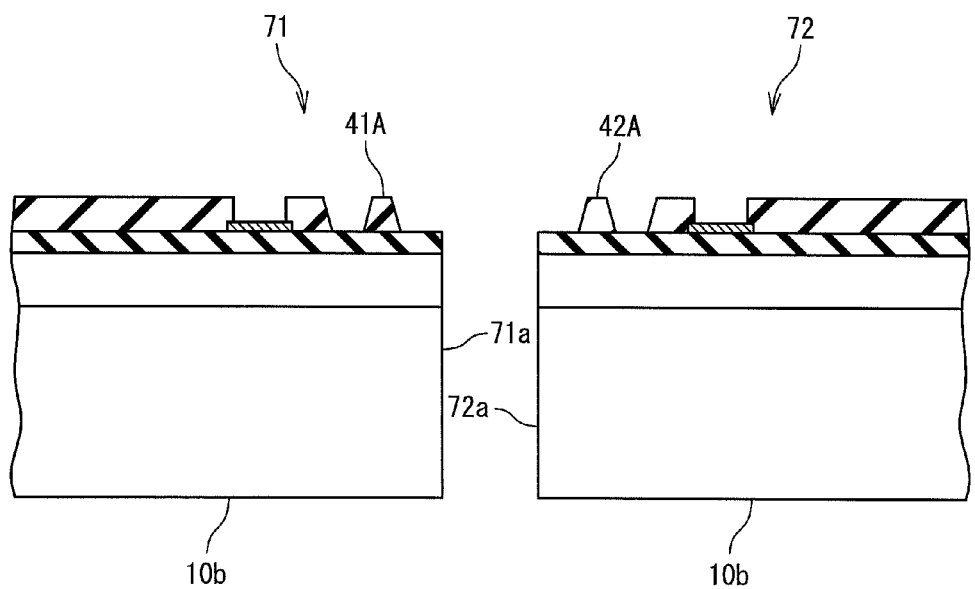
FIG. 8 is a cross-sectional view of diced chips which are generated by dicing the wafer according to the first embodiment.

In FIG. 8, a sidewall 71a of the chip 71 and a sidewall 72a of the chip 72 are cut surfaces formed as a result of the dicing step S12. The chip 71 has a part of the anti-chipping wall 41A and a part of the anti-chipping wall 41B. The chip 72 has a part of the anti-chipping wall 42A and a part of the anti-chipping wall 41B.

According to the present embodiment, the center regions 61A and 61B cut by the dicing blade 80 are not covered by the protection resin films. Therefore, the dicing blade 80 can be prevented from clogging. Moreover, it is prevented that resin shaving generated by the cutting attach to the sidewalls 71a and 72a.

Figure 9:
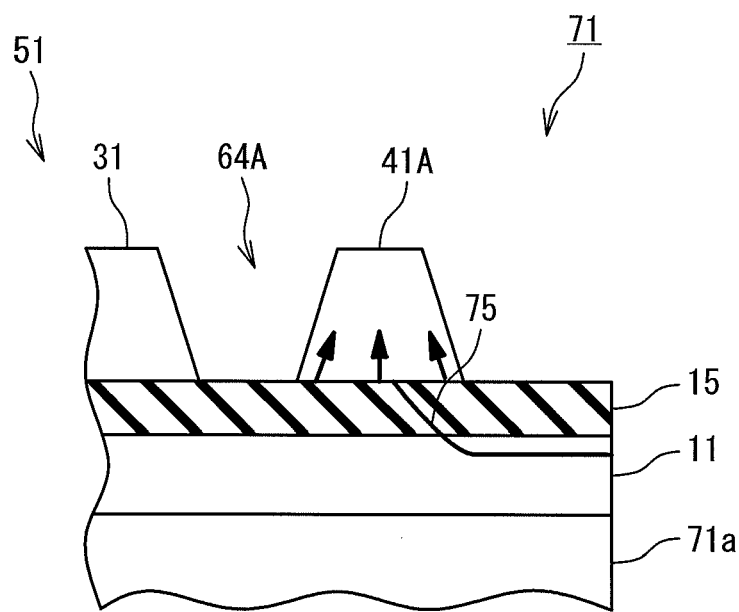
FIG. 9 is a cross-sectional view of the chip for explaining action and effects according to the first embodiment.

Referring to FIG. 9, there exists within the anti-chipping wall 41A internal stress generated when resin cures. A direction of the internal stress is represented by an arrow. Therefore, even if crack 75 is generated towards the chip region 51 in the diffusion layer 11 during the cutting of the center region 61A, the crack 75 progresses towards the surface of the wafer 1 due to the internal stress of the anti-chipping wall 41A and thus the crack 75 can be prevented from reaching the chip region 51.

Figure 10:
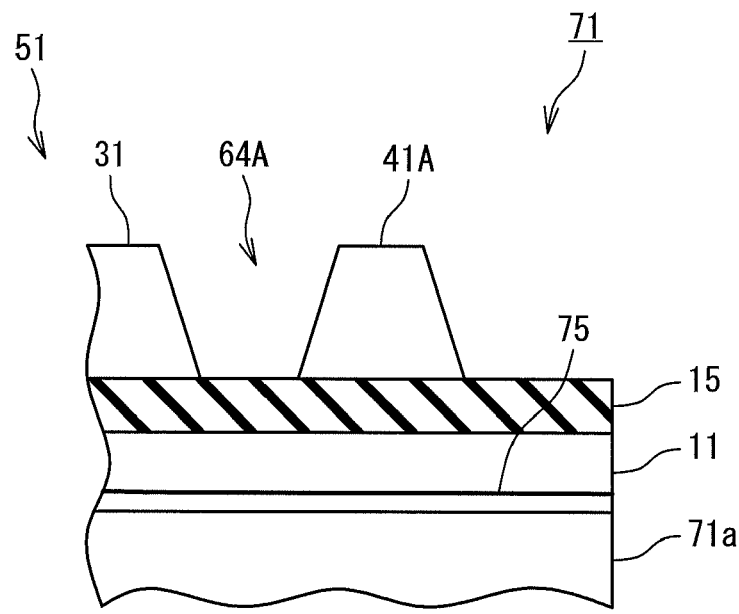
FIG. 10 is a cross-sectional view of the chip for explaining action and effects according to the first embodiment.

Next, the appearance inspection step S14 is carried out with respect to each of the plurality of chips. A case of the chip 71 will be described below. In the Step S14, the appearance inspection as to whether or not the crack 75 is caused in the diffusion layer 11 in the outer region 64A is performed. If no crack 75 is found in the outer region 64A as shown in FIG. 9, the chip 71 is not eliminated. If the crack 75 is found in the outer region 64A as shown in FIG. 10, the chip 71 is eliminated as a defective product. Since an inspector just needs to observe only between the anti-chipping wall and the chip region protection film, the appearance inspection becomes easy. To find the crack is easy, because there is no resin between the anti-chipping wall and the chip region protection film.

In the mounting step S16, the chip that is not eliminated in the appearance inspection step S14 is mounted on a substrate (not shown). A case of the chip 71 will be described below. In the Step S16, the back surface 10b of the chip 71 is attached to the substrate by using resin adhesive (not shown). At this time, the anti-chipping walls 41A or 41B prevents the resin adhesive from flowing to the surface's side (bonding pad 16's side) of the chip 71.

After the mounting step S16, the wire bonding/molding step S18 and the testing/product inspection step S20 are carried out.

Second Embodiment

A method of manufacturing the semiconductor device according to a second embodiment of the present invention includes a "back surface grinding step" in addition to the method of manufacturing the semiconductor device according to the first embodiment. The back surface grinding step is carried out after the opening section formation step S10 and before the dicing step S12.

In the back surface grinding step, the back surface 10b's side of the wafer 1 is ground by using grinding fluid. At this time, the anti-chipping walls 41A and 42A block the grinding fluid flowing in the dicing region 60B, and the anti-chipping walls 41B and 42B block the grinding fluid flowing in the dicing region 60A. It is therefore prevented that the grinding fluid intrudes from the peripheral section into the central section of the wafer 1.

Third Embodiment

Figure 11:
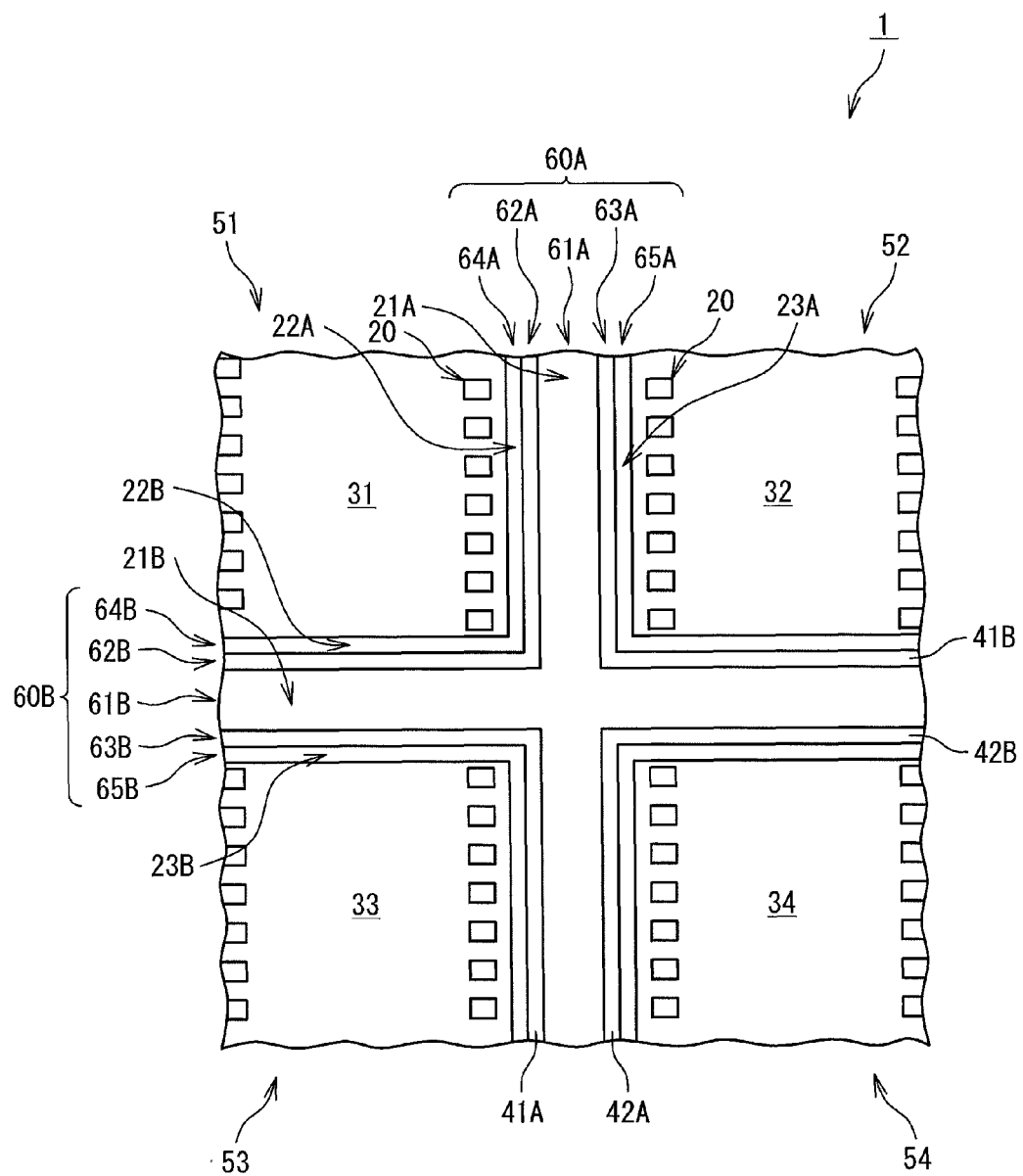
FIG. 11 is a top view of a wafer according to a third embodiment of the present invention.

FIG. 11 shows the top view of a third embodiment of the present invention. In the third embodiment, the anti-chipping walls 41A and 42A do not cross the center regions 61A and 61B. This is the different point from the first embodiment described in FIG. 3. This technical feature enables to prevent the dicing blade from clogging furthermore as compared with the first embodiment. This is because the dicing blade does not cut the anti-chipping walls 41A and 42A.

In the above embodiments, the case where the substrate 10 is the semiconductor substrate has been described. The wafer and the method of manufacturing the semiconductor device according to the present invention can also be applied to a glass substrate.

It should be noted that the method of manufacturing the semiconductor device according to the present invention may be summarized as follows:

(1) A method of manufacturing a semiconductor device comprising: dicing a wafer into a plurality of chips,
wherein said wafer comprises:
a first chip region in which a semiconductor device is formed;
a second chip region in which a semiconductor device is formed; and
a first dicing region,
wherein said first chip region and said second chip region are separated from each other by said first dicing region,
wherein a part of said first dicing region sandwiched by said first chip region and said second chip region comprises:
a first center region extending in a first longitudinal direction of said first dicing region;
a first intermediate region located on said first chip region's side of said first center region and extending in said first longitudinal direction;
a second intermediate region located on said second chip region's side of said first center region and extending in said first longitudinal direction;
a first outer region located on said first chip region's side of said first intermediate region and extending in said first longitudinal direction; and a second outer region located on said second chip region's side of said second intermediate region and extending in said first longitudinal direction,
wherein a surface of said first intermediate region is covered by a bank-shaped first resin film extending in said first longitudinal direction,
a surface of said second intermediate region is covered by a bank-shaped second resin film extending in said first longitudinal direction, and
respective surfaces of said first center region, said first outer region and said second outer region are not covered by resin films,
wherein said dicing said wafer into said plurality of chips comprises: cutting said first center region along said first longitudinal direction.

(2) The method may further comprise: performing an appearance inspection as to whether or not crack is caused in said first outer region, after said dicing said wafer into said plurality of chips.

(3) The method may further comprise: mounting a first chip including said first chip region on a substrate, said first chip begin formed in said dicing said wafer into said plurality of chips,
wherein said mounting said first chip on said substrate comprises:
attaching a back surface of said first chip to said substrate by using resin adhesive; and
preventing, by said first resin film, said resin adhesive from flowing to the surface's side of said first chip.

(4) The method may further comprise: forming said first resin film and said second resin film, before said dicing said wafer into said plurality of chips,
wherein said forming said first resin film and said second resin film comprises:
forming a blanket resin film to cover an entire surface of said wafer; and
performing opening section formation in which an opening section for exposing a bonding pad is formed with respect to a part of said blanket resin film covering a surface of said first chip region, an opening section for exposing a bonding pad is formed with respect to a part of said blanket resin film covering a surface of said second chip region, an opening section is formed with respect to a part of said blanket resin film covering the surface of said first center region, an opening section is formed with respect to a part of said blanket resin film covering the surface of said first outer region, and an opening section is formed with respect to a part of said blanket resin film covering the surface of said second outer region.

(5) The method may further comprise: grinding a back surface of said wafer, before said dicing said wafer into said plurality of chips,
wherein said wafer further comprises:
a third chip region in which a semiconductor device is formed; and
a second dicing region,
wherein said first chip region and said third chip region are separated from each other by said second dicing region, and
said first dicing region and second dicing region are orthogonal to each other,
wherein a part of said second dicing region sandwiched by said first chip region and said third chip region comprises:
a second center region extending in a second longitudinal direction of said second dicing region;
a third intermediate region located on said first chip region's side of said second center region and extending in said second longitudinal direction;

a fourth intermediate region located on said third chip region's side of said second center region and extending in said second longitudinal direction;

a third outer region located on said first chip region's side of said third intermediate region and extending in said second longitudinal direction; and a fourth outer region located on said third chip region's side of said fourth intermediate region and extending in said second longitudinal direction, wherein a surface of said third intermediate region is covered by a bank-shaped third resin film extending in said second longitudinal direction, a surface of said fourth intermediate region is covered by a bank-shaped fourth resin film extending in said second longitudinal direction, respective surfaces of said second center region, said third outer region and said fourth outer region are not covered by resin films, said first resin film and said second resin film extend in said first longitudinal direction so as to cross said second dicing region, and said third resin film and said fourth resin film extend in said second longitudinal direction so as to cross said first dicing region, wherein in said grinding said back surface of said wafer, said first resin film and said second resin film block grinding fluid flowing in said second dicing region.

It is apparent that the present invention is not limited to the above embodiments and may be modified and changed without departing from the scope and spirit of the invention.

What is claimed is:

1. A wafer comprising:

a first chip region on a substrate covered with an insulating layer and in which a semiconductor device is formed;

a second chip region on the substrate and in which a semiconductor device is formed; and a first dicing region on the substrate, wherein said first chip region and said second chip region are separated from each other by said first dicing region, wherein a part of said first dicing region sandwiched by said first chip region and said second chip region comprises:

a first center region extending in a first longitudinal direction of said first dicing region;

a first intermediate region located on said first chip region's side of said first center region and extending in said first longitudinal direction;

a second intermediate region located on said second chip region's side of said first center region and extending in said first longitudinal direction;

a first outer region located on said first chip region's side of said first intermediate region and extending in said first longitudinal direction; and a second outer region located on said second chip region's side of said second intermediate region and extending in said first longitudinal direction, wherein a surface of said first intermediate region is covered by a bank-shaped first resin film extending in said first longitudinal direction, a surface of said second intermediate region is covered by a bank-shaped second resin film extending in said first longitudinal direction, and respective surfaces of said first center region, said first outer region and said second outer region are not covered by resin films, the wafer further comprising, a third chip region on the substrate and in which a semiconductor device is formed; and a second dicing region on the substrate, wherein said first chip region and said third chip region are separated from each other by said second dicing region, and said first dicing region and second dicing region are orthogonal to each other, wherein a part of said second dicing region sandwiched by said first chip region and said third chip region comprises:

a second center region extending in a second longitudinal direction of said second dicing region;

a third intermediate region located on said first chip region's side of said second center region and extending in said second longitudinal direction;

a fourth intermediate region located on said third chip region's side of said second center region and extending in said second longitudinal direction;

a third outer region located on said first chip region's side of said third intermediate region and extending in said second longitudinal direction; and a fourth outer region located on said third chip region's side of said fourth intermediate region and extending in said second longitudinal direction, wherein a surface of said third intermediate region is covered by a bank-shaped third resin film extending in said second longitudinal direction, a surface of said fourth intermediate region is covered by a bank-shaped fourth resin film extending in said second longitudinal direction, respective surfaces of said second center region, said third outer region and said fourth outer region are not covered by resin films, said first resin film and said second resin film extend in said first longitudinal direction so as to completely cross said second dicing region, and said third resin film and said fourth resin film extend in said second longitudinal direction so as to completely cross said first dicing region.

2. A wafer comprising a substrate covered with an insulating layer and two wafer dicing regions that extend orthogonal to each other and that each separates respective chip areas that are each covered with a protective film, each of said two wafer dicing regions comprising:

a center region in which the protective film is not present and the center region is open to expose the insulating layer, the center region being adapted to be cut by a wafer dicing tool;

intermediate regions on opposite sides of said center region; and outer regions on sides of said intermediate regions opposite said center region, the protective film not being present in said outer regions and said outer regions being open to expose the insulating layer, wherein said intermediate regions comprise the protective film covering said insulating layer, said intermediate regions being adapted to absorb dicing stress from the substrate, and wherein each of said intermediate regions extends completely through an intersection of said two wafer dicing regions, traversing said center region.

3. The wafer of claim 2, wherein said center region extends completely through an intersection of said two wafer dicing regions.

4. A semiconductor device comprising a semiconductor chip, said semiconductor chip comprising:

a substrate;

a first insulating film on said substrate;

an electrode pad on said first insulating film;

a second insulating film on said first insulating film;

a first region; and a second region between said first region and an outer edge of said semiconductor chip, wherein said second region comprises, a third region that surrounds said first region and in which said first insulating film is exposed, a fourth region that surrounds said third region and in which said second insulating film is on said first insulating film, and a fifth region between said fourth region and said outer edge of said semiconductor chip and in which said first insulating film is exposed.

* * * * *